United States Patent [19]
Jacobsen et al.

[11] Patent Number: 6,066,361
[45] Date of Patent: May 23, 2000

[54] METHOD FOR COATING A FILAMENT

[75] Inventors: Stephen C. Jacobsen; Michael R. McNeely; David L. Wells, all of Salt Lake City, Utah

[73] Assignee: Sarcos L.C., Salt Lake City, Utah

[21] Appl. No.: 09/363,543

[22] Filed: Jul. 29, 1999

Related U.S. Application Data

[62] Division of application No. 09/021,103, Feb. 10, 1998.

[51] Int. Cl.$^7$ ........................................................ B05D 5/06
[52] U.S. Cl. ....................... 427/163.2; 427/165; 427/166; 427/282
[58] Field of Search ................................. 427/163.2, 164, 427/165, 166, 167, 282

[56] References Cited

U.S. PATENT DOCUMENTS

| | | |
|---|---|---|
| 1,595,735 | 8/1926 | Schmierer . |
| 2,015,885 | 10/1935 | Dällenbach . |
| 2,068,741 | 1/1937 | Geffcken et al. . |
| 2,856,561 | 10/1958 | Giezendanner . |
| 2,998,546 | 8/1961 | Kuntz et al. . |
| 3,013,182 | 12/1961 | Russell . |
| 3,050,623 | 8/1962 | McNaney . |
| 3,182,200 | 5/1965 | McNaney . |
| 3,398,349 | 8/1968 | Evans . |
| 3,401,448 | 9/1968 | Iles et al. . |
| 3,512,041 | 5/1970 | Dalmasso . |
| 3,534,467 | 10/1970 | Sachs et al. . |
| 3,548,254 | 12/1970 | Pahlavan . |
| 3,586,959 | 6/1971 | Eccles . |
| 3,609,675 | 9/1971 | Abele . |
| 3,663,839 | 5/1972 | Low et al. . |
| 3,701,123 | 10/1972 | Barrett et al. . |
| 3,786,307 | 1/1974 | Robinson . |
| 3,875,479 | 4/1975 | Jaggar . |
| 3,878,407 | 4/1975 | Hartemann et al. . |
| 3,947,722 | 3/1976 | Strom et al. . |
| 3,965,925 | 6/1976 | Gooch . |
| 3,976,508 | 8/1976 | Mlavsky . |
| 4,198,851 | 4/1980 | Janata . |
| 4,310,767 | 1/1982 | Peacock . |

(List continued on next page.)

FOREIGN PATENT DOCUMENTS

| | | |
|---|---|---|
| 3809-972A | 3/1988 | Germany . |
| 60-132395 | 7/1985 | Japan . |
| 60-240125 | 4/1986 | Japan . |
| 0166629 | 6/1989 | Japan . |
| 64-323745 | 12/1989 | Japan . |

*Primary Examiner*—Shrive Beck
*Assistant Examiner*—Bret Chen
*Attorney, Agent, or Firm*—Thorpe, North & Westerb

[57] ABSTRACT

A method of coating a surface of a filament. In particular, the invention rotates a member (13) about a first axis (54), which will rotate a tubular member (16), which is rotatably coupled to the rotating member at an angle to the first axis, through a plane and about a longitudinal axis (56) of the tubular member that is co-planer to the plane. This is done to assist in the depositing of a uniform material onto the filament that extends through the tubular member and through a deposition area (40). It is important for the method to maintain the deposition area at an intersection of the first axis, longitudinal axis and plane, while the filament is being rotated in step. The method provides for adjusting the deposition area to expose a different length of the filament to the deposition of material thereon. Additionally, the method further comprises the steps of: un-winding a length of the filament that is in a feed basket coupled to one end of the tubular member; feeding the filament length through the tubular member; and collecting the filament length in a receiving basket that is coupled to another end of the tubular member. It is noted that there is a step of rotating a traction wheel, which is fixedly coupled about the tubular member at an end opposite to where the tubular member is rotatably coupled to the rotating member, about the longitudinal axis to cause the tubular member to rotate through the plane and about the co-planer longitudinal axis. Wherein the traction wheel runs along a top surface of a circular wall that is located equal distant about the first axis.

17 Claims, 3 Drawing Sheets

U.S. PATENT DOCUMENTS

| | | |
|---|---|---|
| 4,432,098 | 2/1984 | Gelinas . |
| 4,455,643 | 6/1984 | Smith et al. . |
| 4,458,248 | 7/1984 | Lyasko . |
| 4,514,250 | 4/1985 | Minezaki . |
| 4,550,444 | 10/1985 | Uebel . |
| 4,660,607 | 4/1987 | Griffith et al. . |
| 4,763,340 | 8/1988 | Yoneda et al. . |
| 4,771,366 | 9/1988 | Blake et al. . |
| 4,772,928 | 9/1988 | Dietrich et al. . |
| 4,850,044 | 7/1989 | Block et al. . |
| 4,873,613 | 10/1989 | Iversen . |
| 4,884,167 | 11/1989 | Mine . |
| 4,903,732 | 2/1990 | Allen . |
| 4,917,579 | 4/1990 | Torma . |
| 4,929,050 | 5/1990 | Wilson . |
| 4,940,508 | 7/1990 | Shamouilian et al. . |
| 4,944,826 | 7/1990 | Zollman et al. . |
| 4,959,275 | 9/1990 | Iguchi et al. . |
| 4,962,495 | 10/1990 | Gibbons et al. . |
| 4,964,940 | 10/1990 | Auvert et al. . |
| 5,006,925 | 4/1991 | Bregman et al. . |
| 5,016,138 | 5/1991 | Woodman . |
| 5,016,481 | 5/1991 | Jacobsen et al. . |
| 5,053,856 | 10/1991 | Davidson . |
| 5,106,455 | 4/1992 | Jacobsen et al. . |
| 5,124,508 | 6/1992 | DuBrucq . |
| 5,131,976 | 7/1992 | Hoko . |
| 5,217,037 | 6/1993 | Bristol . |
| 5,241,410 | 8/1993 | Streck et al. . |
| 5,246,746 | 9/1993 | Michalske et al. ................... 427/163.2 |
| 5,269,882 | 12/1993 | Jacobsen . |
| 5,270,485 | 12/1993 | Jacobsen . |
| 5,273,622 | 12/1993 | Jacobsen . |
| 5,320,659 | 6/1994 | Ishiguro et al. ..................... 427/163.2 |
| 5,336,960 | 8/1994 | Shimizu et al. . |
| 5,346,520 | 9/1994 | Meabon et al. ....................... 427/163.2 |
| 5,349,863 | 9/1994 | Dumont et al. . |
| 5,372,350 | 12/1994 | Kawabe . |
| 5,451,774 | 9/1995 | Jacobsen . |
| 5,481,184 | 1/1996 | Jacobsen . |
| 5,594,330 | 1/1997 | Jacobsen . |
| 5,610,747 | 3/1997 | Jacobsen . |
| 5,634,194 | 5/1997 | Jacobsen . |
| 5,673,131 | 9/1997 | Jacobsen . |
| B1 4,020,830 | 9/1984 | Johnson et al. . |

METHOD FOR COATING A FILAMENT

This application is a division of Ser. No. 09/021,103, filed Feb. 10, 1998.

BACKGROUND OF THE INVENTION

1. Field of the Invention

The present invention relates to a method and apparatus for nonplanar micro-fabrication and processing on flexible, filamentary structures. More particularly, the present invention relates to a method and apparatus for physical vapor deposition of materials on long, flexible filamentary substrates by holding each end of a deposition area on the filament to maintain the filament in a substantially straight configuration and to physically mask the filament outside the deposition area, and by simultaneously rotating the filament about one or two axes to uniformly deposit the material on the filament.

2. Prior Art

Lithographic techniques have been utilized for some time in the manufacture especially of integrated circuit boards and semiconductor devices and related products. The products manufactured have typically included planar surfaces to which the lithographic techniques were applied. Such techniques have proven extremely effective in the precise manufacturing and formation of very small details in the product. However, attempts to apply such techniques to other than planar surfaces have proven difficult, if not unachievable, until recently. With recent developments in nonplanar lithography, the fabrication of microstructures, including both three-dimensional mechanical parts and three-dimensional electrical components, has become more readily achievable. U.S. Pat. No. 5,106,455, issued Apr. 21, 1992, to Jacobsen et al. discloses a method and apparatus for fabricating microstructures using nonplanar, exposure beam lithography. Using this method and apparatus, very fine, precise and detailed physical structures can be formed on very small three-dimensional objects such as, for example, cylinders. U.S. Pat. No. 5,269,882, issued Dec. 14, 1993, to Jacobsen discloses a method and apparatus for fabricating thin-film semiconductor devices using nonplanar, exposure beam lithography. In particular, a variety of semiconductor devices can be formed on three-dimensional substrates, again such as cylinders. The methods and apparatus disclosed in the above two patents provide for fabrication of individual microstructures or thin-film semiconductor devices in a type of batch processing approach. U.S. Pat. No. 5,273,622, issued Dec. 29, 1993, to Jacobsen discloses a continuous processing approach for fabricating microstructures and thin-film semiconductor devices. Such microstructures are finding use in a variety of areas including medical devices, robotics, navigation equipment, motors and similar equipment. U.S. Pat. No. 5,481,184, issued Jan. 2, 1996, to Jacobsen discloses a system for movement actuators and sensors on very small mechanical parts, such as fibers and filaments. U.S. Pat. No. 5,270,485, issued Dec. 14, 1993, to Jacobsen discloses a three-dimensional circuit structure with electrical components formed on the surfaces of elongated cylindrical substrates. With the development of these very small (termed "micro") mechanical devices and electrical elements, the ability to fabricate detailed features of such devices and elements in an efficient and precise way is greatly desired.

The problems faced in fabricating detailed features of these microstructures include the extremely small size of the features and structures and also the nonplanar nature of the structures. In addition, the structures may be relatively long and flexible.

OBJECTS AND SUMMARY OF THE INVENTION

It is an object of the present invention to provide a method and apparatus for fabricating microstructures utilizing lithographic techniques.

It is another object of the present invention to provide such a method and apparatus which allows the fabrication of fine details over nonplanar surface areas of a workpiece.

It is yet another object of the present invention to provide such a method and apparatus in which an elongated workpiece or substrate may be processed.

It is yet another object of the present invention to provide such a method and apparatus in which a flexible, filamentary workpiece or substrate may be processed.

It is a further object of the present invention to provide a method and apparatus for depositing a material on a nonplanar, flexible filamentary substrate by physical vapor deposition processes.

These and other objects and advantages of the present invention are realized in a fixture apparatus having a tubular member for holding the filamentary substrate and rotatably disposed on a base. The tubular member has an opening through which material may be deposited on the surface of the filamentary substrate. A pair of tubes are slidingly disposed in the tubular member on either side of the opening defining a deposition area on the surface of the filamentary substrate. The tubes may be moved toward one another or away from each other to adjust the size of the deposition area. A pair of baskets are each disposed on the ends of the tubular member in which the filamentary substrate is coiled for storage.

The tubes may be formed integrally with the tubular member or be omitted altogether. The tubes and/or the tubular member hold the filamentary substrate on both sides of the deposition area to maintain the straight configuration of the filamentary substrate and to prevent sagging or drooping. Therefore, long, flexible, filamentary substrates may have material deposited on their surfaces with the tubes and/or tubular member maintaining the straight configuration and the baskets storing the excess length. This allows for filamentary substrates that are long, or for a series of structures on the same filamentary substrate, to be processed.

In addition, the tubes and/or tubular member physically masks the filamentary substrate on both sides of the deposition area. Physically masking the filamentary substrate maintains sharp material edges and prevents undesired material deposition on the filamentary substrate outside the deposition area.

The fixture apparatus also has a traction wheel fixedly coupled to one end of the tubular member and disposed on a circular path of the base. The other end of the tubular member is rotatably coupled to a rotating member of the base. The rotating member of the base turns and causes the tubular member, and thus the filamentary substrate, to turn about a vertical axis. The traction wheel also rolls on the base about the vertical axis as the rotating member turns. As the wheel rolls about the vertical axis, the tubular member, and thus the filamentary substrate, is also rotated about a horizontal axis, or longitudinal axis of the tubular member. Therefore, the filamentary substrate is rotated about two different axes, horizontal and vertical, to uniformly deposit material on the surface of the substrate.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention.

Figure 1:
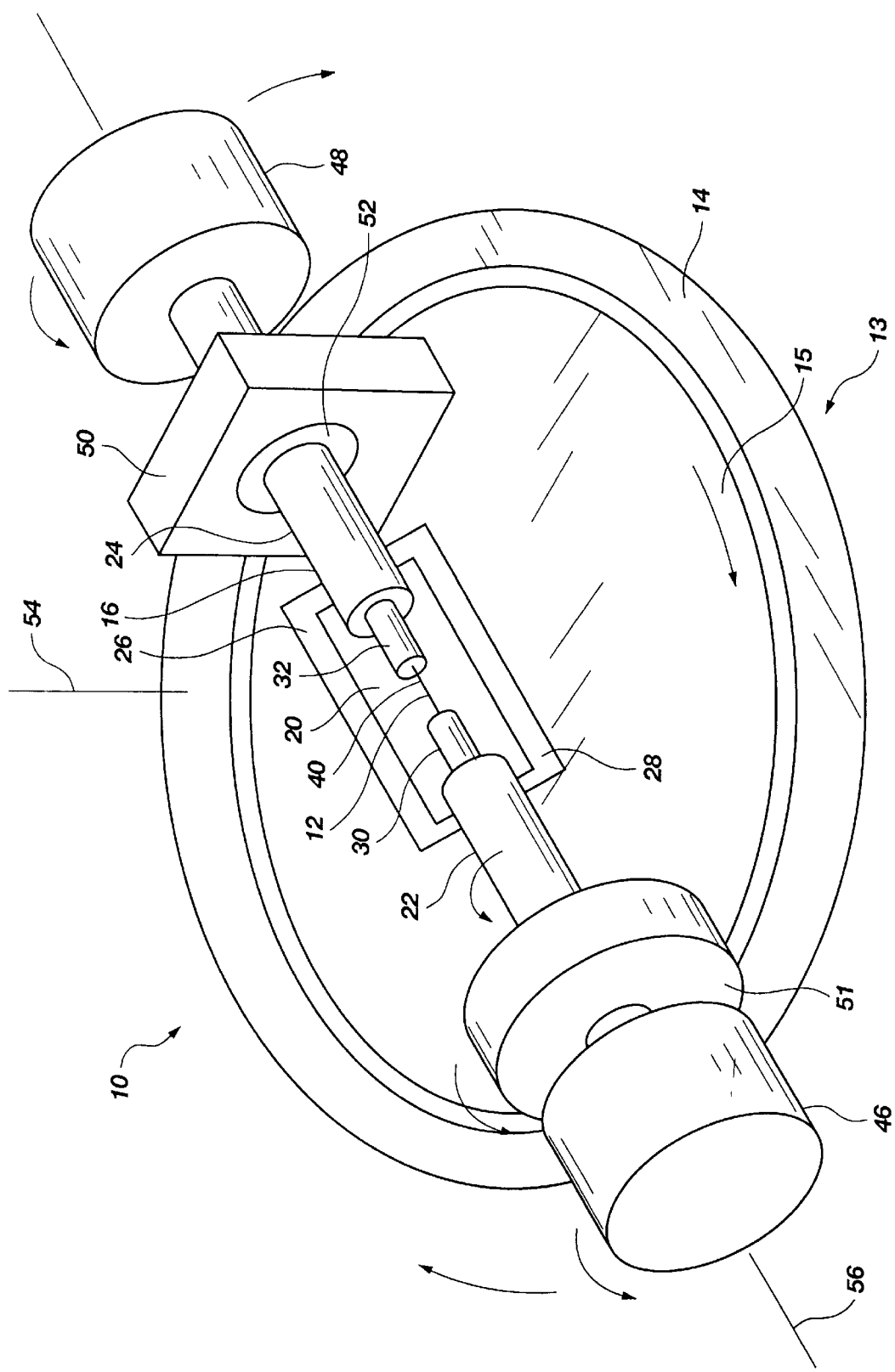
FIG. 1 is a perspective view of a preferred embodiment of the apparatus for holding and rotating a filamentary substrate of the present invention.
Figure 2:
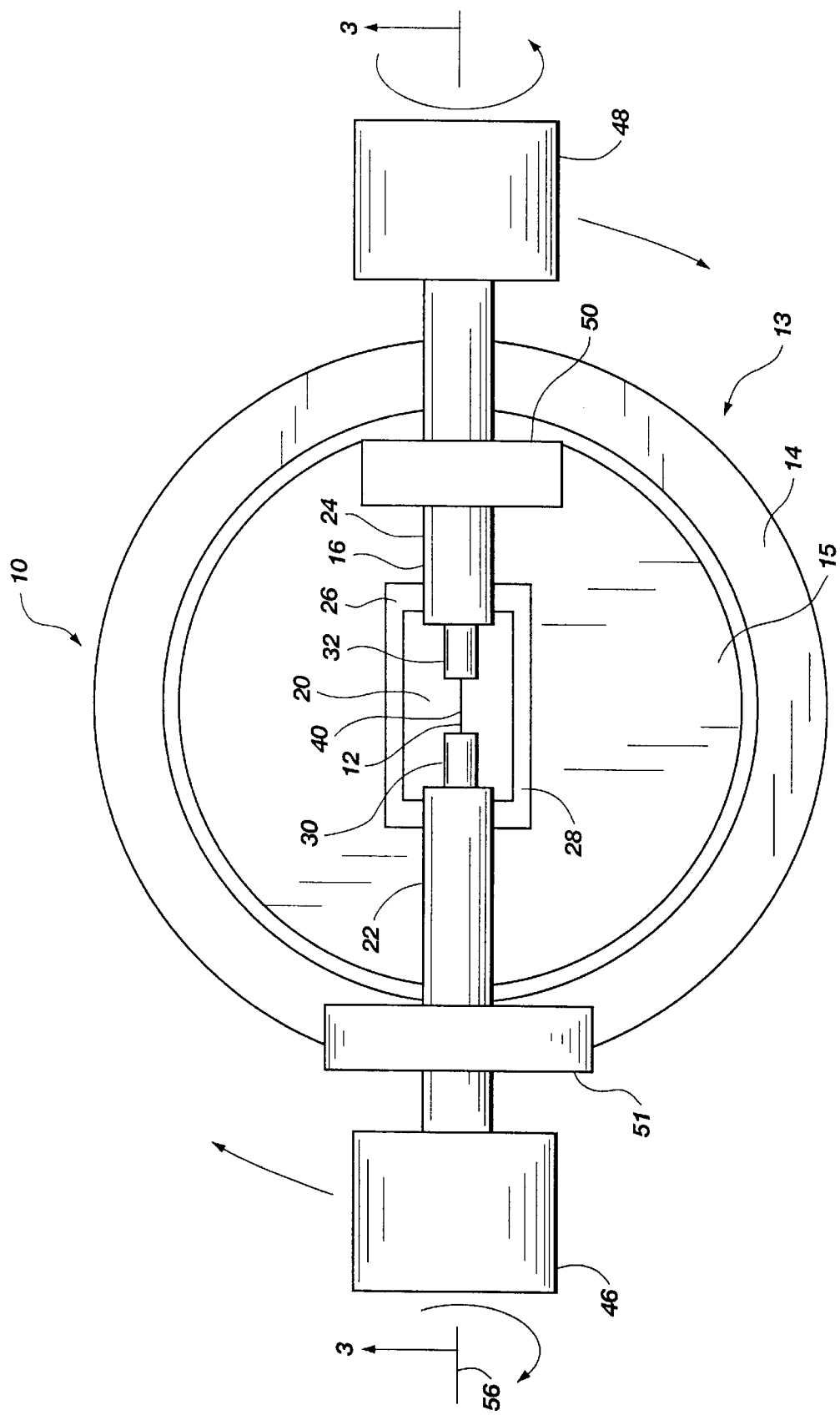
FIG. 2 is a top view of a preferred embodiment of the apparatus for holding and rotating a filamentary substrate of the present invention.
Figure 3:
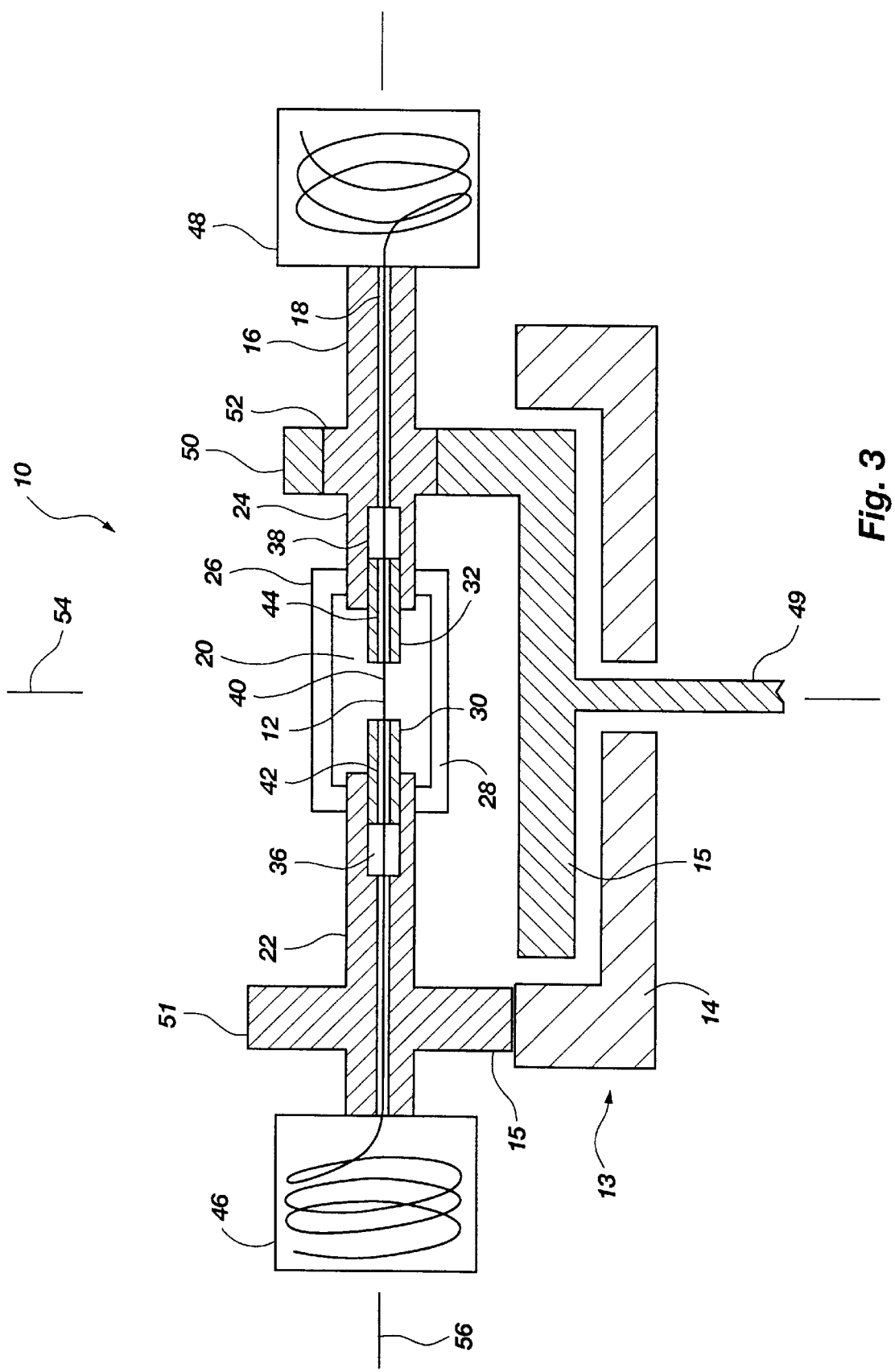
FIG. 3 is a cross-sectional view of a preferred embodiment of apparatus for holding and rotating a filamentary substrate of the present invention taken along line 3—3 of FIG. 2.

As illustrated in FIGS. 1–3, a preferred embodiment of a fixture apparatus, indicated generally at 10, for holding and rotating a long, flexible, nonplanar, filamentary substrate 12 for material deposition or processing of the present invention is shown. As shown, the filamentary substrate 12 may be an optical fiber. The material deposited on the filamentary substrate 12 may be platinum or PZT. The deposition of a metal, such as platinum, and a piezoceramic, such as PZT, on an optical fiber is useful in the construction of filamentary sensors and actuators. Alternatively, the filamentary substrate and deposited material may be selected to create the desired microstructure, including three-dimensional mechanical parts and three-dimensional electrical components. For example, the filamentary substrate may be a cylindrical bar and the material deposited may be a conductor material or insulator material to create nonplanar semiconductor devices. Thus, the material deposited may be a semiconductor material, such as amorphous silicon. The filamentary substrate may be a polymer fiber, a metal filament or fiber, a ceramic fiber, or a glass fiber.

The fixture apparatus 10 has a base or base member indicated generally at 13. The base 13 is disposable within a deposition chamber (not shown) or exposed to a deposition source (not shown). The base 13 may be cylindrical or have a circular wall 14 and have a rotating member 15, the purpose of which will be discussed below.

The fixture apparatus 10 also advantageously has an elongated, hollow tubular member 16 for holding the filamentary substrate 12. The tubular member 16 is rotatably disposed on the base 12. The tubular member 16 is hollow, or has an elongated opening 18 extended through the tubular member along its length from one end to the other, as shown in FIG. 3. The elongated opening 18 is configured for receiving and containing the long, flexible substrate 12, which extends through the tubular member.

The tubular member 16 has an opening 20 formed therein generally in the center of the length of the tubular member 16 through which the filamentary substrate 12 is exposed to the deposition source and through which material is deposited on the surface of the filamentary substrate. The opening 20 is formed by a gap separating a first portion 22 and a second portion 24 of the tubular member 16. A pair of braces 26 and 28 support and join the first and second portions 22 and 24 of the tubular member 16 and maintain the portions 22 and 24 in axial alignment.

The fixture apparatus 10 advantageously has a pair of movable tubes 30 and 32 which are each slidingly disposed in the tubular member 16 at opposing sides of the opening 20 for holding and/or masking the filamentary substrate 12. The tubes 30 and 32 are slidingly disposed in first and second holes 36 and 38 formed in the first and second portions 22 and 24 of the tubular member, respectively, as shown in FIG. 3. The holes 36 and 38 are sized and configured to allow the tubes 30 and 32 to slide back and forth. The tubes 30 and 32 define a deposition area 40 on the filamentary substrate 12, or the surface area of the filamentary substrate to be exposed. The tubes 30 and 32 may be slid together or apart to decrease or increase the size of the deposition area 40. It is of course understood that the tubes 30 and 32 may be formed integrally with the tubular member 16 or may be extensions of the tubular member. The tubes 30 and 32 are hollow, or have an elongated openings 42 and 44 extending through the tubes from one end to the other, as shown in FIG. 3. The elongated openings 42 and 44 are sized and configured to receive and hold the filamentary substrate 12.

The tubes 30 and 32, or tubular member 16, advantageously hold the filamentary substrate 12 on both sides of the deposition area 40 to prevent the filamentary substrate 12 from drooping or sagging, or to maintain the filamentary substrate 12 in a substantially straight configuration. Therefore, long, flexible, filamentary substrates, or a series of filamentary structures formed in one long length, may be processed without the filamentary substrate bending. The tubular member and/or moveable tubes are some examples of a holding means for holding the filamentary substrate in a substantially straight configuration. It is of course understood that different methods or devices may be used in place of the tubular member and/or tubes. For example, a pair of clamps may hold the filamentary substrate on either side of the deposition area.

In addition, the tubes 30 and 32, or tubular member 16, advantageously physically masks the portion of the filamentary substrate 12 outside the deposition area 40. Thus, the tubes 30 and 32 maintain sharp material edges on the filamentary substrate and prevent undesired material deposition on the filamentary substrate. The moveable tubes and/or tubular member are some examples of masking means for preventing undesirable material deposition on the filamentary substrate. It is of course understood that different methods or devices may be used in place of the tubes and/or tubular member. For example, the filamentary substrate may be masked by a material applied directly to its surface.

A pair of baskets, drums, or spools 46 and 48 are each advantageously disposed on opposing ends of the tubular member 16 in which the filamentary substrate 12 is coiled or otherwise disposed for storage. Thus, the filamentary substrate 12 is fed from one basket 46, through the tubular member 16 where it is exposed to the deposition source at the opening 20, and into the other basket 48. In this manner, relatively long, filamentary substrates may be processed without breaking the length of the filamentary substrate.

As indicated above, the base 13 has a circular wall or path 14 and a rotating member 15. The base 13 may be cylindrical or disk-shaped and have a cylindrical or disk-shaped cavity formed therein, forming the circular wall 14. The rotating member 15 may be disposed within the cylindrical cavity and rotate within the circular path 14. A shaft 49 is coupled to the rotating member 15 and causes it to rotate, as shown in FIG. 3. A motor or the like (not shown) may be used to turn the shaft 49 and the rotating member. A bracket 50 is formed on the rotating member 15. Although the base 13 and rotating member 15 are shown as cylindrical or disk-shaped, it is of course understood that the illustrated shapes are unnecessary to the present invention. For example, the base may be merely a plate and the rotating member an arm rotating with respect to the plate.

The tubular member 16 is rotatably disposed on the base 13. Advantageously, the fixture apparatus 10 has a traction wheel 51 coupled to one side of the tubular member 16 and disposed on the base 13. The traction wheel 51 is rollingly disposed on the circular path 14 of the base. The other side of the tubular member 16 is rotatably coupled to the base 13 by a bearing 52, as shown in FIGS. 1 and 3. The bearing 52 is disposed in the bracket 50. The wheel 51 and bearing 52 support the tubular member 16 above the surface of the base.

The shaft 50 is caused to rotate which turns the rotating member 15 about a vertical axis 54. The vertical axis 54 is generally perpendicular to the horizontal base 13 and passes generally through the center of the tubular member 16 and deposition area 20. As the shaft 50 and the rotating member 15 turn, the tubular member 16, and thus the filamentary substrate 12, turns about the vertical axis 54.

The traction wheel 51 is fixedly coupled to the tubular member 16 so that as the traction wheel rolls about the vertical axis 54 on the base 13, the tubular member 16 rotates about not only the vertical axis 54, but a horizontal axis 56 as well. The horizontal axis 56 is generally concentric with a longitudinal axis of the tubular member 16 and filamentary substrate 12. Because the traction wheel 51 is fixed to the tubular member 16 and rolls about the circular path 14, the tubular member 16 rotates about its longitudinal axis, or the horizontal axis 56. In addition, the tubular member 16 is turned about the vertical axis 54 by the turning of the rotating member 15.

The bearing 52 is disposed in the bracket 50 and rotatably couples the tubular member 16 to the rotating member 15, or base 13, so that as the traction wheel 51 rolls around the vertical axis 54 on the base 13, the bearing 52 permits the tubular member 16 to rotate about the horizontal axis 56 with the traction wheel 51. Because the tubular member 16 is fixed to the traction wheel 51, it rotates with the traction wheel in the same direction as the traction wheel. The bearing 52 is coupled to the tubular member 16 to allow the tubular member to rotated with the traction wheel 51. By rotating the filamentary substrate 12 about two different axes, the vertical axis 54 and the horizontal axis 56, the material may be uniformly deposited on the surface of the filamentary substrate.

The shaft, rotating member, traction wheel, bearing, and/or motor are some examples of a rotating means for rotating the filamentary substrate about two axes. It is of course understood that different methods or devices may be used. For example, separate motors may be used to turn the filamentary substrate about the vertical axis and rotate it about its longitudinal axis. Gears and/or drive belts may be used to turn and rotate the filamentary substrate. The bearing may be disposed in a second wheel and the tubular member caused to turn about the vertical axis on the traction wheel and second wheel/bearing.

An illustrative process for use with the fixture apparatus of FIGS. 1–3 could include first holding the filamentary substrate on both sides of the deposition area to prevent the filamentary substrate from sagging or drooping. A length of the filamentary substrate is coiled or otherwise disposed in the basket 46 for storage. An end of the filamentary substrate is fed into the tubular member 16 and drawn through the opening 20 so that the deposition area is positioned in the opening. The end is coiled or otherwise disposed in the basket 48 for storage.

Both sides of the deposition area 40 are physically masked to provide sharp edge definition of the material and prevent the material from tapering off outside the deposition area. As the filamentary substrate is fed through the tubular member, it is also fed through the pair of movable tubes 30 and 32. The tubes 30 and 32 are slid together or apart to adjust the size of the deposition area. The tubular member 16 may also be used to physically mask the filamentary substrate by forming the movable tubes with the tubular member or by omitting the movable tubes all together. Likewise, the movable tubes may be used to hold the filamentary substrate to maintain it in a substantially straight configuration.

The deposition area of the filamentary substrate is exposed to a deposition source while the filamentary substrate is rotated about two different axes. As the rotating member 15 turns, the tubular member 16, and thus the filamentary substrate 12, is turned about the vertical axis 54. In addition, the wheel 51 rolls on the base 13, causing the tubular member 16, and thus the filamentary substrate 12, to rotate about the horizontal axis 56 concentric with its longitudinal axis.

If the filamentary substrate is a single unit, it may then be removed from the tubular member. If the filamentary substrate comprises a series of units, the filamentary substrate may be advanced through the tubular member so that the next deposition area is exposed in the opening. The portions of the filamentary substrate to be processed and the portion already processed are stored in the baskets.

As indicated above, the filamentary substrate may be an optical fiber, a polymer fiber, a metal filament or fiber, a ceramic fiber, a glass fiber, etc. Also, the material deposited may be a metal such as platinum, an insulator, a semiconductor material such as amorphous silicon, a piezoceramic such as PZT, etc. The material may be deposited by physical vapor deposition (PVD) which includes sputtering, evaporation, etc.

In addition, portions of the deposition area of the filamentary substrate may be photolithographically masked by a photoresist material in a desired pattern. The photoresist material may be deposited onto the filamentary substrate and then patterned. Thus, portions of the deposition area are lithographically masked, defining masked area, while other portions are exposed, defining exposed areas. Therefore, the exposed area for deposition is defined by the photoresist pattern within the physically masked deposition area.

Although the present invention has been described and illustrated as simultaneously rotating the filamentary substrate about two axes, the vertical axis and the horizontal or longitudinal axis, it is of course understood that the method and apparatus of the present invention may be used to rotate the filamentary substrate about a single axis. For example, the rotating member may turn the tubular member, and thus the filamentary substrate, about the vertical axis with the traction wheel disengaged from the base so that the tubular member and filamentary substrate do not turn about the longitudinal or horizontal axis. Likewise, the traction wheel may be a gear that turns the tubular member, and thus the filamentary substrate, about the longitudinal or horizontal axis with the rotating member or shaft disengaged so that the tubular member and filamentary substrate do not turn about the vertical axis.

It is to be understood that the described embodiments of the invention are illustrative only, and that modifications thereof may occur to those skilled in the art. Accordingly, this invention is not to be regarded as limited to the embodiments disclosed, but is to be limited only as defined by the appended claims herein.

What is claimed is:

1. A method of coating a surface of a filament, comprising the steps of:
   a) actuating a rotating member about a first axis;
   b) rotating a tubular member, which is rotatably coupled to the rotating member at an angle to the first axis, through a plane and about a longitudinal axis of the tubular member that is co-planer to the plane; and
   c) depositing a material onto the filament that extends through the tubular member and through a deposition area.

2. The method of claim 1, further comprising the step of:
   maintaining the deposition area at an intersection of the first axis, longitudinal axis and plane, while the filament is being rotated in step b).

3. The method of claim 1, further comprising the step of:
   adjusting the deposition area to expose a different length of the filament to the deposition of material thereon.

4. The method of claim 1, further comprising the steps of:
   a) un-winding a length of the filament that is in a feed basket coupled to one end of the tubular member;
   b) feeding the filament length through the tubular member; and
   c) collecting the filament length in a receiving basket that is coupled to another end of the tubular member.

5. The method of claim 1, wherein the step of rotating the tubular member includes the step of:
   rotating a traction wheel, which is fixedly coupled about the tubular member at an end opposite to where the tubular member is rotatably coupled to the rotating member, about the longitudinal axis to cause the tubular member to rotate through the plane and about the co-planer longitudinal axis.

6. The method of claim 5, wherein the traction wheel runs along a top surface of a circular wall that is located equal distant about the first axis.

7. The method of claim 6, wherein the plane and the longitudinal axis are perpendicular to the first axis.

8. The method of claim 7, wherein the material deposited on the substrate is a metal.

9. The method of claim 7, wherein the material deposited on the substrate is an insulator.

10. The method of claim 7, wherein the material deposited on the substrate is a semiconductor material.

11. The method of claim 7, wherein the material deposited on the substrate is a piezoceramic.

12. The method of claim 7, wherein the filamentary substrate is an optical fiber.

13. The method of claim 7, wherein the filamentary substrate is a polymer fiber.

14. The method of claim 7, wherein the filamentary substrate is a metal filament or fiber.

15. The method of claim 7, wherein the filamentary substrate is a ceramic fiber.

16. The method of claim 7, wherein the filamentary substrate is a glass fiber.

17. The method of claim 7, wherein portions of the deposition area of the filamentary substrate are photolithographically masked with a photoresist material in a desired pattern.

* * * * *